(12) United States Patent
Chiani

(10) Patent No.: US 11,948,047 B2
(45) Date of Patent: Apr. 2, 2024

(54) METHOD FOR SENDING CLASSICAL DATA IN QUANTUM INFORMATION PROCESSING SYSTEMS AND CORRESPONDING SYSTEM

(71) Applicant: ALMA MATER STUDIORUM—Università di Bologna, Bologna (IT)

(72) Inventor: Marco Chiani, Bologna (IT)

(73) Assignee: ALMA MATER STUDIORUM—Università di Bologna, Bologna (IT)

( * ) Notice: Subject to any disclaimer, the term of this patent is extended or adjusted under 35 U.S.C. 154(b) by 174 days.

(21) Appl. No.: 17/624,448

(22) PCT Filed: Jul. 2, 2020

(86) PCT No.: PCT/IB2020/056261
§ 371 (c)(1),
(2) Date: Jan. 3, 2022

(87) PCT Pub. No.: WO2021/001782
PCT Pub. Date: Jan. 7, 2021

(65) Prior Publication Data
US 2022/0374760 A1 Nov. 24, 2022

(30) Foreign Application Priority Data
Jul. 3, 2019 (IT) .................. 102019000010797

(51) Int. Cl.
*G06N 10/70* (2022.01)
*H03M 13/00* (2006.01)
*H03M 13/15* (2006.01)

(52) U.S. Cl.
CPC .......... *G06N 10/70* (2022.01); *H03M 13/159* (2013.01); *H03M 13/611* (2013.01)

(58) Field of Classification Search
CPC ..... G06N 10/70; G06N 10/00; H03M 13/159; H03M 13/611; H03M 13/47; H04L 1/0042
See application file for complete search history.

(56) References Cited

U.S. PATENT DOCUMENTS

| | | | |
|---|---|---|---|
| 2003/0023651 A1* | 1/2003 | Whaley | H04L 9/0852 708/400 |
| 2004/0078421 A1* | 4/2004 | Routt | H04L 9/0852 709/201 |

(Continued)

FOREIGN PATENT DOCUMENTS

EP  2 769 500  8/2014

OTHER PUBLICATIONS

International Search Report for PCT/IB2020/056261 dated Oct. 19, 2020, 3 pages.

(Continued)

*Primary Examiner* — Steve N Nguyen
(74) *Attorney, Agent, or Firm* — Nixon & Vanderhye P.C.

(57) ABSTRACT

A method for sending first data as quantum information in qubits and classical second data over a quantum channel, in particular in quantum information communication systems, includes applying quantum error correction (QECC) encoding to the qubits obtaining quantum information codewords, applying intentional errors with error syndromes representing the second classical data to the quantum information codewords obtaining quantum information codewords with intentional errors applied upon, transmitting from a transmitting side the quantum information codewords with intentional errors applied upon over the quantum channel which outputs received codewords at a receiving side, computing error syndromes from the received codewords, performing a QECC error correction operation on the received codewords by applying a correction operator obtained at least by the (Continued)

computed syndromes to obtain corrected codewords, and outputting the corrected codewords and the computed syndromes.

9 Claims, 5 Drawing Sheets

(56) References Cited

U.S. PATENT DOCUMENTS

| | | | | |
|---|---|---|---|---|
| 2004/0200952 | A1* | 10/2004 | Beausoleil, Jr. | B82Y 10/00 |
| | | | | 250/225 |
| 2007/0145271 | A1* | 6/2007 | Beausoleil | G06N 10/00 |
| | | | | 398/9 |
| 2019/0042966 | A1* | 2/2019 | Hogaboam | G06F 12/1027 |
| 2019/0392342 | A1* | 12/2019 | Leipold | G06N 99/00 |
| 2019/0393400 | A1* | 12/2019 | Leipold | B82Y 10/00 |
| 2020/0119748 | A1* | 4/2020 | Lucarelli | G06N 10/00 |
| 2020/0394546 | A1* | 12/2020 | Bronn | H01L 25/18 |

OTHER PUBLICATIONS

Written Opinion of the ISA for PCT/IB2020/056261 dated Oct. 19, 2020, 5 pages.

Fujiwara Yuichiro, "Parsing a Sequence of Qubits", IEEE Transactions on Information Theory, vol. 59, No. 10, pp. 6796-6806.

* cited by examiner

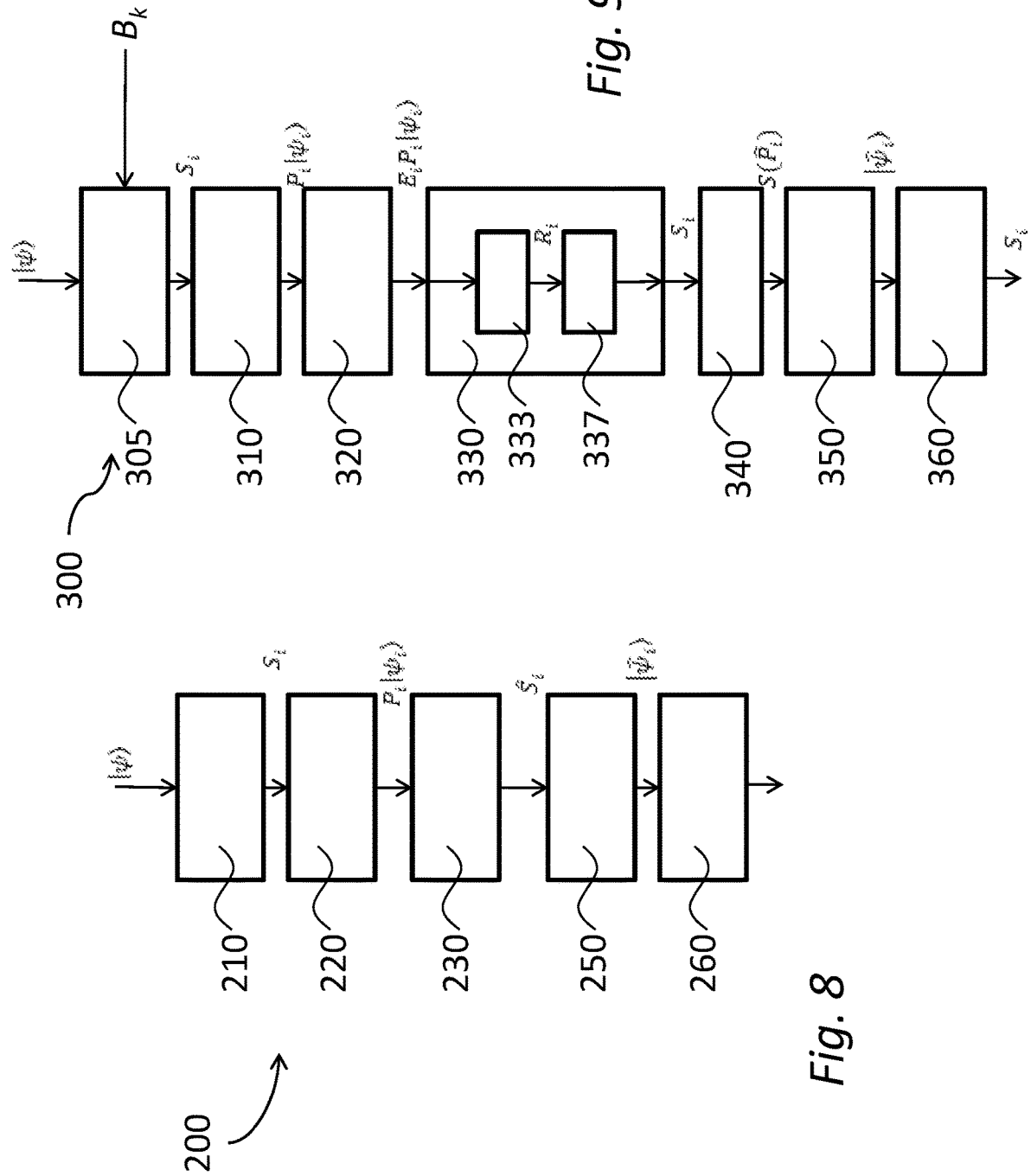

METHOD FOR SENDING CLASSICAL DATA IN QUANTUM INFORMATION PROCESSING SYSTEMS AND CORRESPONDING SYSTEM

This application is the U.S. national phase of International Application No. PCT/IB2020/056261 filed Jul. 2, 2020 which designated the U.S. and claims priority to IT Patent Application No. 102019000010797 filed Jul. 3, 2019, the entire contents of each of which are hereby incorporated by reference.

TECHNICAL FIELD

The present description relates to techniques for sending first data as quantum information in qubits and second classical data in quantum information processing systems over a quantum channel, which includes applying QECC encoding to said qubits obtaining quantum information codewords.

The techniques here described refer to classical data which represents control data for instance for the quantum information network or processing system, or additional data which represent supplementary information, or data which represent synchronization data for the quantum information network or processing system.

TECHNOLOGICAL BACKGROUND

Quantum information processing by systems including quantum computers and quantum networks have been known since some year. Despite the potential advantages in exploiting the peculiarities of quantum mechanics to process information, there are still several problems to solve in the path towards large-scale quantum computers and quantum networks.

One aspect is that the management of such a network will require to exchange control data in addition to the user data. Nodes should be able to identify each packet within a stream of qubits (synchronization), and also to write and read management and control information attached to the qubit stream. For instance, in classical networks adopting the Internet Protocol (IP) each packet contains the source and destination addresses, as well as a hop counter, used and updated by routers. In the following we call "control data" all information besides the user data. In general it is referred to classical data as data which can be described by bits, while quantum information data are carried by quantum states. In classical networks the control data can be transferred on the same physical channel used to carry the user information (in-band control). For example, a fixed pattern of bits (sync word) can be inserted in a packet for frame synchronization. A receiving node reads the bits, for instance by a sliding correlator, until it finds the sync word, indicating the boundaries of a packet. After synchronization, the address of the destination contained in each packet is read and used to forward the packet toward the destination.

However, inserting qubits as control data is not always a viable approach for quantum networks, since in general measuring destroys quantum state superposition. For this reason, several studies assume that quantum networks will need out-of-band control and signaling, since any attempt to read and process control information carried in the quantum channel will destroy its content (see e.g. Quantum Networks for Open Science Workshop. Rockville, MD, USA: Office of Science U Department of Energy, 2018, section 2.5). For example, synchronization patterns of qubits cannot be just embedded in the quantum stream, like in classical networks, as reading the qubit stream until their position is found would destroy the superposition on the user information qubits.

A possible way to solve this problem is to introduce auxiliary orthogonal states used just for synchronization purposes. For instance, one might build a quantum system with qutrits (Hilbert space of dimension three) instead of the usual qubits, where the orthogonal states $|0\rangle$, $|1\rangle$ are used as the basis for information, and an additional orthogonal state $|2\rangle$ is used for synchronization purposes, as for instance discussed in Y. Fujiwara, "Parsing a sequence of qubits", *IEEE Transactions on Information Theory*, vol. 59, no. 10, pp. 6796-6806, 2013. Also, placing patterns of states $|2\rangle$ inserted in different positions along the quantum stream can be used to carry simple metadata. It must be noted that changing the metadata would require to change the pattern of insertions of the $|2\rangle$'s, so that the classical information is practically of read-only type. Besides this limitation, the main difficulty here is related to the need of working with qutrits instead of qubits, with an impact on the overall general system architecture.

Thus, there is the need of an improved solution which allows sending control, or additional, data along with the quantum stream.

OBJECT AND SUMMARY

An object of one or more embodiments is to contribute in providing such an improved solution.

Specifically, an object of the invention is to provide a method that allows operating with qubits without needing out-of-band control and signaling.

According to one or more embodiments, that objective can be achieved by means of a method having the features set forth in the claims that follow. Embodiments moreover concerns a related quantum information transmission system.

As mentioned in the foregoing, the present disclosure provides solutions regarding a method for sending first data as quantum information in qubits and classical second data over a quantum channel, in particular in quantum information communication systems, which includes applying QECC encoding to said qubits obtaining quantum information codewords, wherein said method includes
applying intentional errors having error syndromes representing said second classical data to said quantum information codewords obtaining quantum information codewords with intentional errors applied upon, and
transmitting from a transmitting side said quantum information codewords with intentional errors applied upon over said quantum channel which outputs received codewords at a receiving side,
computing error syndromes from said received codewords,
performing a QECC error correction operation on said received codewords by applying a correction operator obtained at least by said computed syndromes to obtain corrected codewords,
outputting said corrected codewords and said computed syndromes.

In variant embodiments, the method includes encoding information data with a classical error code correction encoder to obtain encoded error syndromes which are applied as said error syndromes to the quantum information codewords, said computing error syndromes from said received codewords including
a step of computing channel affected syndromes from the received codewords and a step of classical syndrome error correction on said channel affected syndromes to obtain classical corrected error syndromes,
said applying a correction operator obtained at least by said computed syndromes to obtain corrected codewords includes
obtaining said correction operator by
performing an operation of computation of the intentional error and of the channel error to which is associated the syndrome on the basis of said channel affected syndromes and said classical corrected error syndromes,
using said computed intentional error and channel error to obtain said correction operator, in particular as inverse of the computed intentional error and channel error.

In variant embodiments, the method includes that said applying a correction operator obtained at least by said computed syndromes to obtain corrected codewords includes obtaining the intentional error from said computed syndromes and computing the correction on the basis of said intentional error, in particular as inverse of the intentional error.

In variant embodiments, the method includes applying intentional errors having error syndromes representing said second classical data to said quantum information codewords obtaining quantum information codewords with intentional errors applied upon includes introducing in the quantum information codewords intentional errors determined by corresponding syndromes.

In variant embodiments, the method includes that said second classical data represent communication control data.

In variant embodiments, the method includes that said second classical data represent a synchronization word which is attached to selected codewords.

The method here described allows, for any quantum communication system employing quantum error correcting codes (QECCs), to read and write classical information on top of quantum information. Specifically, the method defines a communication protocol to send a sequence of classical bits superimposed to qubits protected by QECCs by the introduction of intentional errors on the qubits, so that the classical information is constituted by the error syndrome sequence.

The present disclosure provides also solutions regarding a quantum information transmission system configured to send first data as quantum information in qubits and classical second data over a quantum channel, comprising a quantum information transmission module which includes a QECC encoder configured to apply QECC encoding to said qubits obtaining quantum information codewords,
wherein said quantum information transmission module is configured to
apply intentional errors having error syndromes representing said second classical data to said quantum information codewords obtaining quantum information codewords with intentional errors applied upon, and
transmit from a transmitting side said quantum information codewords with intentional errors applied upon over said quantum channel which outputs received codewords at a receiver module comprised in said system,
said receiver module being configured to
compute error syndromes from said received codewords,
perform a QECC error correction operation on said received codewords by applying a correction operator obtained at least by said computed syndromes to obtain corrected codewords,
output said corrected codewords and said extracted syndromes.

In variant embodiments, said transmitter module includes a classical error code correction encoder configured to encode information data to obtain encoded error syndromes which are applied as said error syndromes to the quantum information codewords,
said receiver module configured to compute error syndromes from said received codewords including one or more modules configured to
compute channel affected syndromes from the received codewords, and
perform a classical syndrome error correction on said channel affected syndromes to obtain classical corrected error syndromes,
an application of a correction operator obtained at least by said computed syndromes to obtain corrected codewords including
obtaining said correction operator by
performing an operation of computation of the intentional error and of the channel error on the basis of said channel affected syndromes and said classical corrected error syndromes,
using said computed intentional error and channel error to obtain said correction operator, in particular as inverse of the computed intentional error and channel error.

In variant embodiments, the receiver module is configured to apply a correction operator obtained at least by said computed syndromes to obtain corrected codewords includes obtaining the intentional error from said computed syndromes and computing the correction on the basis of said intentional error, in particular as inverse of the intentional error.

The claims are an integral part of the technical teaching provided herein with reference to the embodiments.

BRIEF DESCRIPTION OF THE SEVERAL VIEWS OF THE DRAWINGS

Various embodiments will now be described, purely by way of example, with reference to the annexed drawings, wherein:
FIG. 8 represents a diagram flow of an embodiment of the method here described;

FIG. 9 represents a diagram flow of a further embodiment of the method here described.

DETAILED DESCRIPTION OF EXEMPLARY EMBODIMENTS

Figure 1:
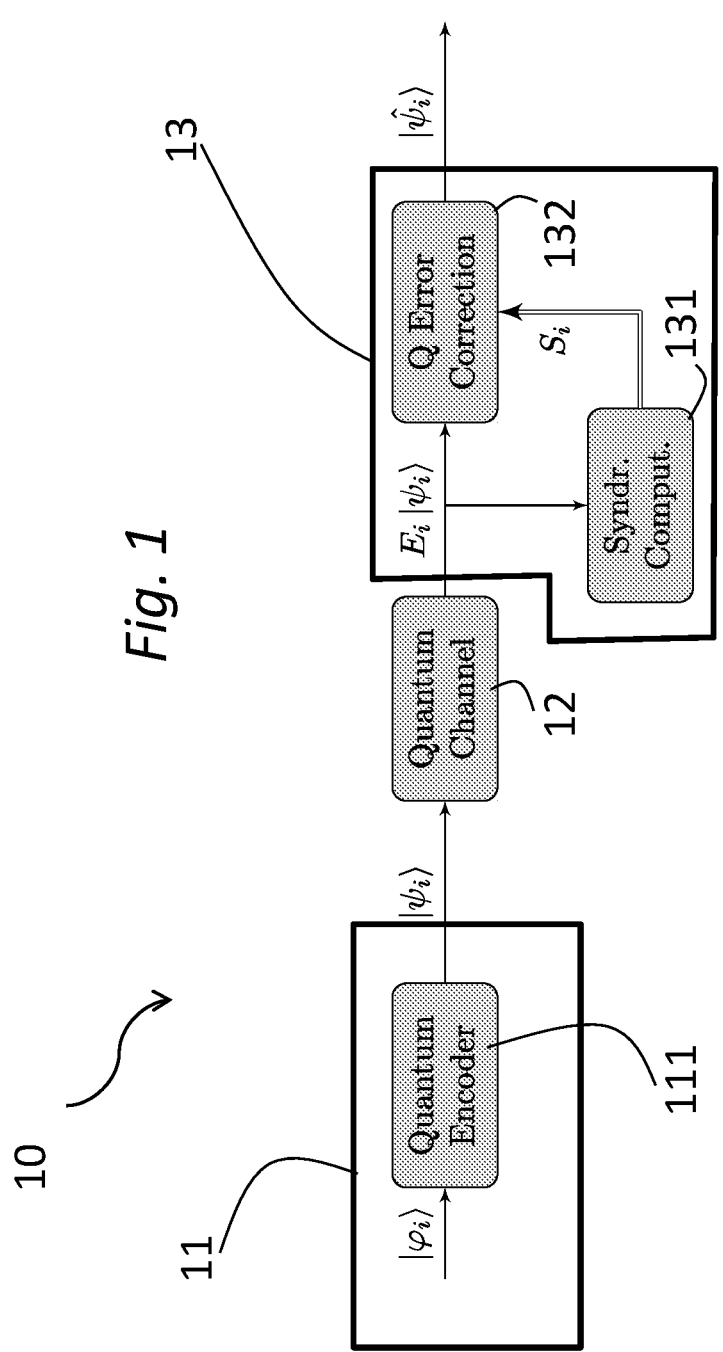
FIG. 1 is a block schematic of a communication system according to the prior art.

In the ensuing description numerous specific details are illustrated in order to enable maximum understanding of the embodiments provided by way of example. The embodiments may be implemented with or without specific details, or else with other processes, components, materials, etc. In other circumstances, structures, materials, or operations that are well known are not shown or described in detail so that various aspects of the embodiments will not be obscured. Reference, in the course of the present description, to "an embodiment" or "one embodiment" indicates that a particular feature, structure, or characteristic described in connection with the embodiment is comprised in at least one embodiment. Hence, phrases such as "in an embodiment" or "in one embodiment" that may be present in various points of the present description do not necessarily refer to one and the same embodiment. Moreover, the particular features, structures, or characteristics may be combined in any convenient way in one or more embodiments.

The terms and references are provided herein merely for convenience of the reader and do not define the sphere of protection or the scope of the embodiments.

The solution here described aims to overcome these drawbacks. The method here described which allows, for any quantum communication system employing quantum error correcting codes (QECCs), to read and write classical information on top of quantum information. Specifically, the method defines a communication protocol to send a sequence of classical bits superimposed to qubits protected by QECCs by the introduction of intentional errors on the qubits, so that the classical information is constituted by the error syndrome sequence.

The method here described applies to quantum systems employing Quantum Error Correction by encoding qubits with Quantum Error Correcting Codes, QECC. Thus, here it is defined the notation and the main elements of QECC. Further information can be found for instance in the publications:

D. Gottesman, "*An introduction to quantum error correction and fault-tolerant quantum computation*," in Quantum information science and its contributions to mathematics, Proceedings of Symposia in Applied Mathematics, vol. 68, 2009, pp. 13-58;

M. A. Nielsen and I. L. Chuang, Quantum Computation and Quantum Information. Cambridge University Press, 2010;

Z. Babar, D. Chandra, H. V. Nguyen, P. Botsinis, D. Alanis, S. X. Ng, and L. Hanzo, "*Duality of quantum and classical error correction codes: Design principles and examples*", IEEE Communications Surveys Tutorials, vol. 21, no. 1, pp. 970-1010, Firstquarter 2019.

Quantum information is here defined as information carried by qubits.

A qubit is an element of the 2-dimensional Hilbert space, $\mathcal{H}^2$. The standard computational basis is denoted by $|0\rangle$, $|1\rangle$. An n-tuple of qubits (n qubits) is an element of the 2n-dimensional Hilbert space, $\mathcal{H}^{2^n}$, with standard computational basis composed by all possible $|i_1\rangle \oplus |i_2\rangle \oplus \ldots \oplus |i_n\rangle$ with $i_j \in \{0,1\}$, $1 \leq j \leq n$.

For a $\in \{0,1\}$ the Pauli operators are denoted as I, X, Z, Y and defined as $I|\alpha\rangle = |\alpha\rangle$, $X|\alpha\rangle = |\alpha \oplus 1\rangle$, $Z|\alpha\rangle = (1)^\alpha |\alpha\rangle$, $Y|\alpha\rangle = i(-1)^\alpha |\alpha \oplus 1\rangle$. These operators either commute or anticommute. The Pauli group $G_n$ on n qubits is generated by all n-fold tensor products of these four operators together with the factors $\pm 1$ and $\pm i$. Two operators in group $G_n$ commute if and only if there is an even number of places where they have different Pauli matrices, neither of which is the identity I.

The solution here described substantially provides, applying intentional errors upon quantum information codewords, i.e. piggybacking via intentional errors for both noiseless and noisy quantum channels.

The solution here described adds classical information, i.e. second data, preferably control data, on top of quantum information representing first data. For example, control data may include annotating the qubits to describe what they represent, who produced them, etc.; more important, it is allowed reading and rewriting this annotation without destroying the quantum information. Another example may be related to the possibility to have a quantum network (QN), where nodes exchange quantum information organized in packets.

In FIG. 1 it is shown a quantum communication system block schematics representing a quantum communication system 10 employing Quantum Error Correction. Such quantum communication system 10 operates between two nodes, e.g. a transmitting side and a receiving side, using QECC to cope with impairments of a quantum channel 12. Such quantum communication system 10, as the systems 10a, 10b described in the following, may be part of a larger communication system, a quantum network or a quantum processing system. The embodiments shown may apply to all QECC schemes, and for the sake of simplicity it is here considered the case of block codes, the generalization to other codes being straightforward. The quantum communication system 10 includes on a transmission side of the quantum channel 12 a transmission module 11 configured to transmit qubits $|\varphi\rangle$ over the quantum channel 12 to a receiver module 13. The transmission module 11 includes a quantum encoder 111 which encodes first data represented by data (logical) k qubits $|\varphi\rangle$ into an n qubits q-codeword $|\psi\rangle$ according to a stabilizer code C, generated by n–k independent operators $g_j \in G_n, j=1, 2 \ldots n-k$. The n qubits q-codeword $|\psi\rangle$ is sent over the quantum channel 12.

In the following, q-codeword and c-codeword indicate if it is referred to quantum information or classical information codewords, respectively.

The codewords are eigenvectors with eigenvalues +1 for all the generators, i.e. $\forall |\psi\rangle \in \mathcal{C}$ it is:

$$g_j|\psi\rangle = +|\psi\rangle, j=1,2 \ldots n-k \qquad (1)$$

while for $\forall |\psi\rangle \notin \mathcal{C}$ there exist at least a j such that $g_j|\psi\rangle = -|\psi\rangle$. It is said that a codeword is stabilized by all generators $g_j$.

A codeword $|\psi\rangle \in \mathcal{C}$ may be affected by a channel error represented by the operator $E \in G_n$, i.e. the error of quantum channel 12. For any generator $g_j$ the error E either commutes or anticommutes. For error correction, the received n qubit $E|\psi\rangle$, i.e. the output of quantum channel 12, is measured according to all the generators $g_1, g_2, \ldots, g_{n-k}$, in a syndrome computation block 131 obtaining a quantum error syndrome $\mathcal{S}(E) = s_1, \ldots, s_{n-k}$, with syndrome element $s_j = +1/-1$ if error E commutes/anticommutes with generator $g_j$. Note that, due to eq. (1), the quantum error syndrome $\mathcal{S}(E)$ depends on error E and not on the particular q-codeword $|\psi\rangle$. Measuring the syndrome $\mathcal{S}(E)$ should not change the quantum state, which remains the received n qubit or codeword E|ψ⟩, which corresponds to the output of quantum channel 12 in FIG. 1. There are m=2n−k possible distinct syndromes $S^{(1)}$, $S^{(2)}$, . . . $S^{(m)}$. It is here indicated by $S^{(1)}=(+1, +1, \ldots +1)$ the syndrome of the operators E (including the identity I, i.e., the no-errors operator) such that the received qubit E|ψ⟩ is still a valid q-codeword. Also, it is denoted by $\Omega^{(i)}$ the set of channel errors on the n qubits producing the syndrome $S^{(i)}$, and by $Q^{(i)} \in G_n$ the error in the set $\Omega^{(i)}$ of channel errors which is assumed for error correction by the QECC decoding block 132. It is underlined that, for degenerate quantum codes, correcting according to error $Q^{(i)}$ may also work to correct other errors in the set $\Omega^{(i)}$ which act the same way on the codewords. The set of correctable errors is identified by $\{Q^{(i)}, Q^{(2)}, \ldots, Q^{(m)}\}$, and their equivalents for degenerate codes.

The measured syndrome is used to estimate the error, i.e. the block 131 supplies the measured syndrome to Quantum Error Correcting Codes (QECC) decoder 132. More precisely, if the measured syndrome, measured by block 131, is $S^{(i)}$, then the QECC decoder 132 assumes the error $Q^{(i)}$ (or one equivalent to it for degenerate codes) occurred. Once the error has been detected, the inverse error operator $(Q^{(i)})^\dagger$ can be applied to recover the state to a valid codeword.

Figure 5:
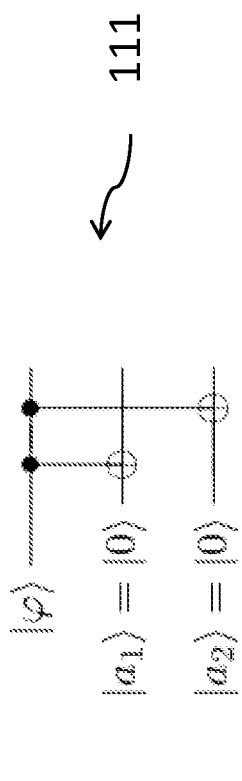
FIGS. 5 to 7 represents quantum circuits according to the prior art which can be used to implement the method here described.

A simple example of QECC encoding is that of a repetition code, which maps a data qubit α|0⟩+β|1⟩ into a q-codeword α|000⟩+β|111⟩. In FIG. 5 it is represented a quantum circuit embodiment of the QECC encoder 111 performing such encoding. As generators it is possible to choose $g_1 = Z \otimes Z \otimes I$ and $g_2 = I \otimes Z \otimes Z$. Measuring a q-codeword will therefore produce the syndrome $S^{(1)}=(+1, +1)$. The code can correct any single bit-flip error occurring on a q-codeword: if the first qubit is flipped, the received 3 qubits status is α|100⟩+β|011, and the measured syndrome will be $S^{(2)}=(-1,+1)$. It is underlined that, after the measurements, the state of the received 3 qubits remains unchanged. The syndrome $S^{(2)}$ is due to one bit-flip error on the first qubit, or to the bit-flip of the last two qubits.

Assuming the code is used for single errors, the QECC decoder 132 will just apply $Q^{(2)}=X \otimes I \otimes I$ to the received 3 qubits in order to bit-flip the first qubit, recovering the error. Similarly, a bit-flip on the second qubit will produce the syndrome $S^{(3)}=(-1, -1)$, and a bit-flip on the third will produce the syndrome $S^{(1)}=(+1, -1)$.

Now it is described the method for sending first data as quantum information in qubits and second data, i.e. classical information preferably representing control data, in quantum information processing systems over a quantum channel, which includes applying QECC encoding to said qubits obtaining quantum information codewords according to the invention.

Given a (n,k) QECC encoding used, i.e. in block 111, to encode a sequence |φ_0⟩, |φ_1⟩, |φ_2⟩, . . . of k data qubits producing a sequence of n qubits q-codewords |ψ_0⟩, |ψ_1⟩, |ψ_2⟩, . . . with |ψ⟩∈$\mathcal{C}$, the method provides, instead of transmitting on the channel 12 the codewords |ψ_i⟩ as in FIG. 1 from the quantum encoder 111, previously inserting at the transmitter side 11 deliberately and in a controlled way, by piggybacking, some intentional errors $P_0, P_1, P_2$ . . . indicating with $S_0, S_1, S_2$, . . . the corresponding error syndromes. It is chosen that the intentional errors $P_i$ belong to the set of correctable errors, i.e. $P_i \in \{Q^{(1)}, Q^{(2)}, \ldots, Q^{(m)}\}$ so that such intentional errors $P_i$ can be later corrected by the QECC correction block, or QECC decoder, 132. At the receiver side 13a, the block 132 which computes the quantum error syndromes is configured to estimate a sequence of measured syndromes errors $\hat{S}_0, \hat{S}_1, \hat{S}_2 \ldots$.

Figure 2:
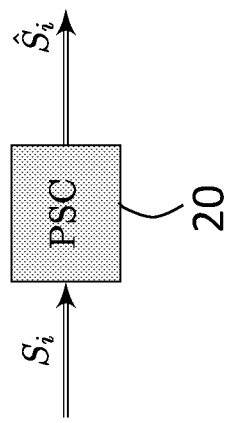
FIG. 2 is a block schematics of a channel according to the present solution.

In this way it is created, in piggyback on the quantum stream, an m-ary discrete-input discrete-output classical channel, where the symbol alphabet, for both the input and the output of such classical channel is the set of all possible syndromes $\{S^{(1)}, S^{(2)}, \ldots, S^{(m)}\}$, with m=2n−k. Thus the set of all possible syndromes $\{S^{(1)}, S^{(2)}, \ldots, S^{(m)}\}$ represents the set of symbols to represent the second classical data, in particular control data or sync words. This m-ary discrete-input discrete-output classical channel is called here the piggyback syndrome channel (PSC), indicated with 20 in the simple block schematics of FIG. 2, to which error syndromes $S_0, S_1, S_2$, are input and from which measured syndromes $\hat{S}_0, \hat{S}_1, \hat{S}_2$ . . . are output.

Now, the method here proposed is described in detail with reference to the block schematics in figure of a communication system 10a, which includes a transmitter module 11a at the transmitter side which transmits quantum information over a noiseless quantum channel 12a to a receiver module 13 at the receiver side. The case of a noisy channel is treated afterwards. The transmitter module 11a includes the QECC encoder 111 generating from a i-th qubits |φ_i⟩, i being the index in a sequence of input qubits, a corresponding q-codeword |ψ_i⟩. A block 112 in the transmitter module 11a represents a controlled error insertion block 112 which is configured to apply an intentional error $P_i \in \{Q^{(1)}, Q^{(2)}, \ldots, Q^{(m)}\}$ to said i-th q-codeword |ψ_i⟩. The controlled error insertion block 112 is configured to apply, through application of intentional errors $P_i$ to the i-th q-codeword |ψ_i⟩, error syndromes, representing second classical data with respect to first data represented by the input qubits |φ_i⟩, to the quantum information codewords |ψ_i⟩, obtaining quantum information codewords with intentional errors applied upon, i.e. piggybacked, $P_i|ψ_i⟩$. Piggybacking in the context of the solution here described means attaching classic information to the q-codeword, by introducing in the q-codeword intentional errors, i.e. specifically applying an intentional error operator $P_i$ to the ket representing the quantum state of the encoded q-codeword. The sequence of error syndromes $S_0, S_1, S_2$ . . . represents the classical information that it is desired to piggyback on the quantum stream. Since the noiseless quantum channel 12a does not introduce further errors, at the output of the channel are received n qubits corresponding to the quantum information codewords with intentional errors applied upon $P_i|ψ_i⟩$, which are sent to the syndrome computation block 131 for extracting the syndrome. The measured syndrome measured at block 131 is $\hat{S}_i = \mathcal{S}(P_i) = S_i$.

Figure 3:
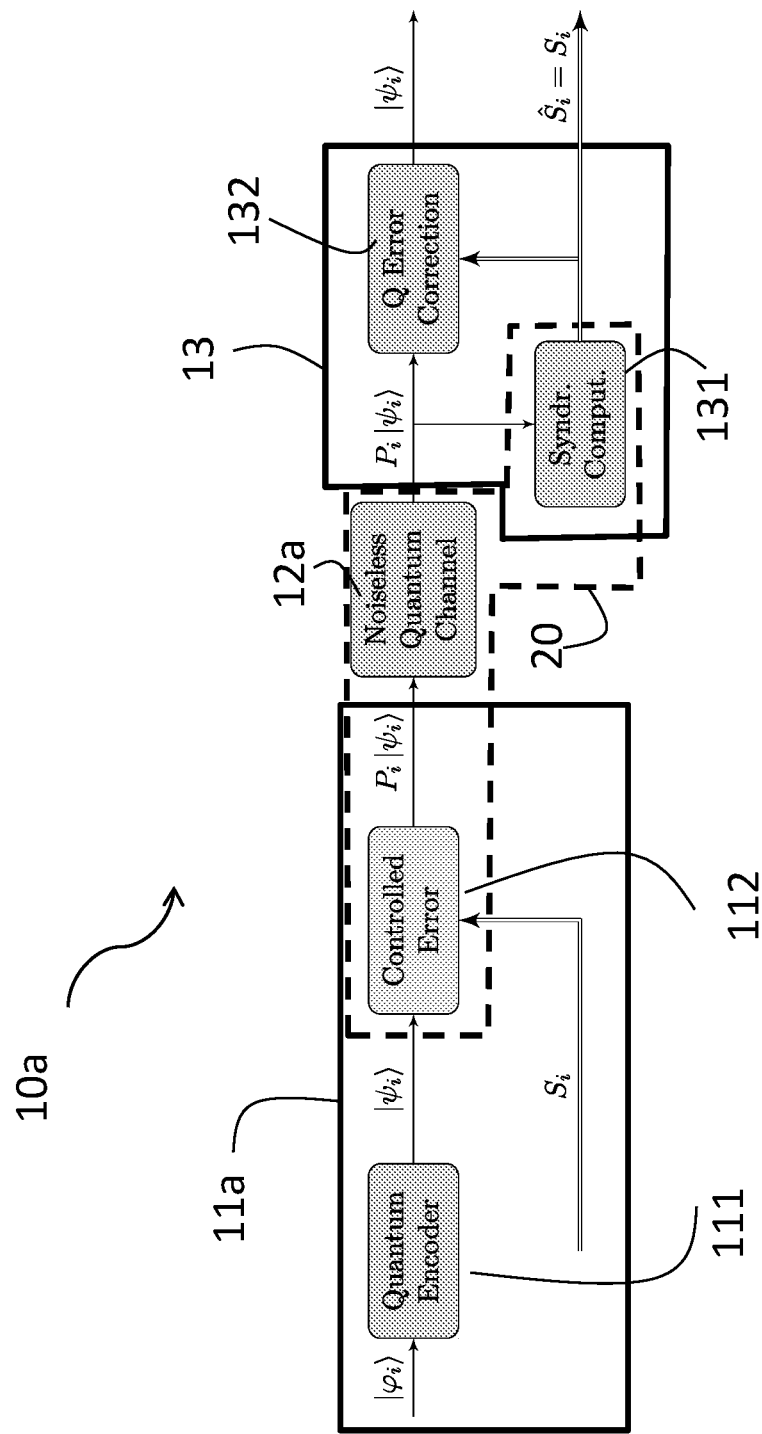
FIG. 3 is a block schematic of a first embodiment of a communication system implementing the method here described.

It is underlined that in FIG. 3 lines transporting classical data are shown by a double line, while lines transporting quantum information are represented by a single line.

Therefore, the received sequence of measured syndromes, $\hat{S}_0, \hat{S}_1, \hat{S}_2$ . . . reproduces the sequence of error syndromes $S_0, S_1, S_2$ . . . transmitted through the PSC channel 20, which in this case correspond to blocks 112, 12a, 131. Then, from the measured syndromes, the intentional quantum errors $P_i$ on the received n qubits, i.e. quantum information codewords with intentional errors applied upon, $P_i|ψ_i⟩$ are sent to QECC correction block 132 in the receiver 13 to be corrected by applying $\hat{P}_i^\dagger$, i.e. the inverse of intentional quantum error operators $P_i$, restoring the q-codewords |ψ_i⟩. Since the computation of syndromes at the receiver side, i.e. module 13a, does not destroy quantum superposition, with this syndrome-based transmission method it is obtained a noiseless discrete-input discrete-output classical channel superimposed to the quantum stream.

This method can be used to annotate the quantum stream for several uses. For example, it is possible to add to a group of q-codewords a description in the form of classical bits, which can be read and rewritten without altering the quantum information.

An example is illustrated in Table 1 herebelow.

TABLE 1

| | | | | | $\|\psi_i\rangle$ | | | | |
|---|---|---|---|---|---|---|---|---|---|
| | ... | $\|\psi_1\rangle$ | $\|\psi_2\rangle$ | $\|\psi_3\rangle$ | $\|\psi_4\rangle$ | $\|\psi_5\rangle$ | $\|\psi_6\rangle$ | $\|\psi_7\rangle$ | ... |
| $S_i$ | ... | $s^{(3)}$ | $s^{(1)}$ | $s^{(2)}$ | $s^{(4)}$ | $s^{(4)}$ | $s^{(1)}$ | $s^{(3)}$ | ... |
| | | | | | $P_i\|\psi_i\rangle$ | | | | |
| | ... | $Q^{(3)}\|\psi_1\rangle$ | $Q^{(1)}\|\psi_2\rangle$ | $Q^{(2)}\|\psi_3\rangle$ | $Q^{(4)}\|\psi_4\rangle$ | $Q^{(4)}\|\psi_5\rangle$ | $Q^{(1)}\|\psi_6\rangle$ | $Q^{(3)}\|\psi_7\rangle$ | ... |
| $\hat{S}_i$ | ... | $s^{(3)}$ | $s^{(1)}$ | $s^{(2)}$ | $s^{(4)}$ | $s^{(4)}$ | $s^{(1)}$ | $s^{(3)}$ | ... |

In Table 1, each row indicates a sequence for a different quantity as a function of index i, which is the column index in the table. The first row indicates the q-codewords $|\psi_i\rangle$ at input, the second row specifies the sequence of intentional quantum errors $S_i$, the third row specifies the corresponding correctable error operator $Q^{(i)} \in G_n$, with the syndrome $S^{(i)}$, which is then indicated in the fourth row as measured syndrome $\hat{S}_i$.

TABLE 2

| | c-information | | | | | | |
|---|---|---|---|---|---|---|---|
| | −1 +1 | +1 −1 | +1 +1 | −1 −1 | +1 +1 | +1 −1 | −1 +1 |
| Q-packet | $Q^{(2)}\|\psi_1\rangle$ | $Q^{(4)}\|\psi_2\rangle$ | $Q^{(1)}\|\psi_3\rangle$ | $Q^{(3)}\|\psi_4\rangle$ | $Q^{(1)}\|\psi_5\rangle$ | $Q^{(4)}\|\psi_6\rangle$ | $Q^{(2)}\|\psi_7\rangle$ |

In Table 2 it is shown an example, in which is performed the piggybacking of 14 classical bits of information −1+1+1−1+1+1−1−1+1+1+1−1−1+1 over a quantum packet composed of 7 q-codewords. Each q-codeword $|\psi_i\rangle = \alpha_i|000\rangle + \beta_i|111\rangle$ is originated by a repetition [[3, 1]] QECC whose error syndromes are $S^{(1)}=(+1, +1)$, $S^{(2)}=(−1, +1)$, $S^{(3)}=(−1, −1)$, $S^{(4)}=(+1, −1)$. Thus, the 14 bits are introduced as error syndromes $S^{(2)}, S^{(4)}, S^{(1)}, S^{(3)}, S^{(1)}, S^{(2)}$, shown in the first row as classical information or C-information, determining the Q-packets in the second row of Table 2, introducing the corresponding intentional errors in the corresponding q-codewords. Here $Q^{(i)} \in Gn$ is the intentional error having syndrome $S^{(i)}$, and therefore $Q^{(1)}$=no error, $Q^{(2)}$=bit-flip on the first qubit, $Q^{(3)}$=bit-flip on the second qubit, $Q^{(4)}$=bit-flip on the third qubit.

In Table 3 it is instead shown how a pattern of errors can be added in piggyback for frame synchronization. The pattern, which can be on top of a portion of the user qubits or over an entire packet, must be designed to cope with errors, similarly to classical frame synchronization

TABLE 3

| | DATA | | | | DATA + SYNC WORD | | | |
|---|---|---|---|---|---|---|---|---|
| ... | $\|\psi_1\rangle$ | $\|\psi_2\rangle$ | $\|\psi_3\rangle$ | $\|\psi_4\rangle$ | $Q^{(4)}\|\psi_5\rangle$ | $Q^{(2)}\|\psi_6\rangle$ | $Q^{(3)}\|\psi_7\rangle$ | ... |
| ... | $s^{(1)}$ | $s^{(1)}$ | $s^{(1)}$ | $s^{(1)}$ | $s^{(4)}$ | $s^{(2)}$ | $s^{(3)}$ | ... |

As shown in Table 3, quantum information frames, as the one shown in the first row of Table 3, are composed of a given number, e.g. 7 q-codewords.

A sync word determined by a pattern of syndromes is applied to a sequence of q-codewords in the frame. The first four q-codewords have errors syndromes attached, $S^{(1)}$, which as shown determine $Q^{(1)}$=no error at the receiver 13a, in particular at block 132, thus represent the user data, or first data, in the frame, while the last three q-codewords are user data plus a sync word, represented by errors syndrome $S^{(4)}, S^{(2)}, S^{(3)}$ which intentional error P are introduced in the last three codewords, to form the sync word in the frame. It is underlined that the user data in the frame relating to the last three q-codewords are preserved, thus the frame in this portion carries both user data and sync word.

Based on the above, in FIG. 8 it is shown a diagram flow of an embodiment 200 of the method for sending first data as quantum information in qubits ($|\varphi\rangle$) and second classical data over a quantum channel, in particular in quantum information communication systems like system 10a or 10b shown in the following, which includes applying QECC encoding, e.g. by block to said qubits ($|\varphi\rangle$) obtaining quantum information codewords, applied to a noiseless channel 12a.

Such method 200 includes a step 210 of applying intentional errors $P_i$ having error syndromes $S_i$, representing the second classical data to the quantum information codewords $|\psi\rangle$ obtaining quantum information codewords with intentional errors $P_i$ applied upon $P_i|\psi_i\rangle$ i.e. by using block 112, and transmitting 220 from a transmitting side, e.g. module 11a, such quantum information codewords with intentional errors applied upon $P_i|\psi_i\rangle$ over said quantum channel 12a which outputs received codewords $P_i|\psi_i\rangle$ at a receiving side, in particular at a receiving module 13, computing 230 error syndromes $\hat{S}_i$, i.e. measuring error syndromes $\hat{S}_i$ from said received codewords $P_i|\psi_i\rangle$, e.g. at block 131, performing a QECC error correction operation 250, e.g. in block 132, on said received codewords $P_i|\psi_i\rangle$ by applying a correction operator $\hat{P}_i^\dagger$ obtained at least by said computed syndromes $\hat{S}_i$ to obtain corrected codewords $|\hat{\psi}_i\rangle$, outputting 260 such corrected codewords $|\hat{\psi}_i\rangle$) and said computed syndromes $\hat{S}_i$.

Figure 4:
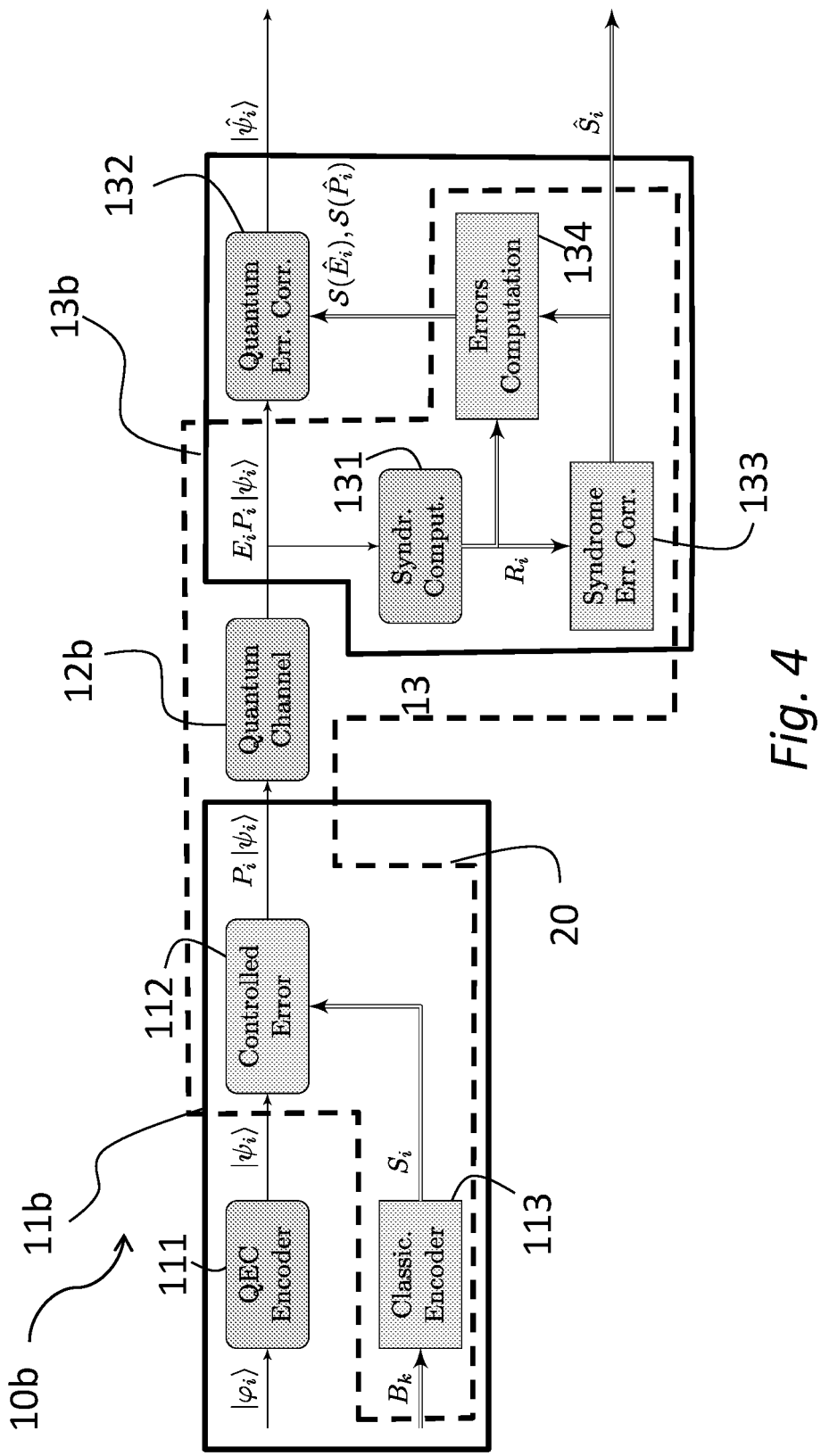
FIG. 4 is a block schematic of a second embodiment of a communication system implementing the method here described.

Now, the method in case of a noisy quantum channel will be described with reference to the block schematics in FIG. 4, showing a further embodiment of a quantum information communication system 10b.

Also here the intentional error $P_i \in \{Q^{(1)}, Q^{(2)}, \ldots, Q^{(m)}\}$ is applied on the i-th q-codeword, but the quantum channel 13b is noisy, i.e. introduces an error $E_i \in G_n$. If the quantum channel introduces an error $E_i \in G_n$, the measured syndrome $\hat{S}_i$ at the receiver side, which is represented by a receiver module 13b, is that of a combined error $E_i P_i$ of the channel error $E_i$ and of the intentional error, that it is denoted by $\hat{S}_i = S(E_i P_i)$. Therefore, the PSC 20, which, as it will be shown in the following, includes blocks 112, 113, 12b, 131, 133, 134, can be seen as a noisy channel, which takes as input the syndrome $S_i$ and produces the output measured syndrome $\hat{S}_i$ which can be different from error syndrome $S_i$ on the transmitter side 11b if the quantum channel 12b introduces a channel error $E_i$ at time i, i.e. the time corresponding to the sending of the i-th qubit or q-codeword over the quantum channel 12b.

To cope with the noisy PSC it is possible to apply classical error correction for the piggy-backed channel, as depicted in FIG. 4.

In FIG. 4, the system 10b is described therefore, where a transmitter module 11 includes a classic encoder 113 which encodes classic information data $B_k$ and outputs error syndromes $S_i$, forming c-codewords of a classic code.

Then the controlled error insertion block 112 is configured to apply an intentional error $P_i \in \{Q^{(1)}, Q^{(2)}, \ldots, Q^{(m)}\}$ to said i-th q-codeword $|\psi_i\rangle$ based on the error syndromes $S_i$ supplied by the classic encoder 113. Quantum information codewords with intentional errors applied upon, i.e. piggy-backed, $P_i|\psi_i\rangle$ are consequently sent over the noisy quantum channel 13b.

The codes used by the classic encoder 113 to protect the syndromes can be any classical error correction code type, such as e.g. BCH (Bose-Chaudhuri-Hocquenghem), RS (Reed-Solomon), Convolutional, LDPC (Low Density Parity Check), Turbo, Polar. At the receiver side, i.e. at a receiver module 13b, the errors introduced by the quantum channel 12b on the received syndromes can be corrected with high probability.

At the receiver side 13b received codewords $E_i P_i|\psi_i\rangle$ are sent to the QECC correction block 132 and to the syndrome computation block 131. The syndrome computation block 131 computes in this case channel affected error syndromes $R_i$, which are determined from the received codewords $E_i P_i|\psi_i\rangle$). Channel affected error syndromes $R_i$ are fed to a classical syndrome error correction block 133 which is configured to correct the errors introduced by the noisy quantum channel 12b in the channel affected error syndromes $R_i$, thus configured to compute from the channel affected error syndromes $R_i$ the measured error syndromes $\hat{S}_i$, which are sent both to a block 134 performing error computation, i.e. configured to compute the intentional error syndrome $S(P_i)$ and the channel error syndrome $S(E_i)$, which are then fed to the correction block 131 outputting the corrected codeword $|\hat{\psi}_i\rangle$ as further output of the communication system corrected in block 14 by applying the inverse operator of the combined intentional and channel error operator, $\hat{P}_i^\dagger \hat{E}_i^\dagger$.

This because the presence of both intentional errors $P_i$ and channel errors $E_i$ requires also to modify the quantum error correction procedure at the receiver side. In fact, assuming the channel error $E_i$ introduced by the noisy quantum channel 12b is correctable, there are two possibilities:
1) it can happen that the combined error $E_i P_i$ is correctable, and in this case the quantum correction based on the syndrome of the combined error $E_i P_i$ will work;
2) it can happen that the combined error $E_i P_i$ is not correctable, i.e., that combined error $E_i P_i \notin \{Q^{(1)}, Q^{(2)}, \ldots, Q^{(m)}\}$. For example, if the correction block 131 is able to correct at most a single qubit error per q-codeword, the intentional error $E_i$ plus an eventual quantum channel error $P_i$ could produce errors on two qubits, that makes the usual quantum error correction based on the syndrome of the combined error $E_i P_i$, i.e. measured syndrome $S(E_i P_i)$, to fail.

However, this does not represent a problem if classical correction of errors on the PSC 20 has been successful, since, once the intentional error $P_i$ has been estimated, the channel error $E_i \in \{Q^{(1)}, Q^{(2)}, \ldots, Q^{(m)}\}$ producing the measured syndrome $S(E_i P_i)$, is easily found.

More precisely, $S(E_i P_i) = S(E_i) \circ S(P_i)$, where $\circ$ denotes the element-wise product (Hadamard product). Then, since the syndrome elements are $\pm 1$, it follows that the error channel syndrome $S(E_i)$ is equal to $S(E_i P_i) \circ S(P_i)$.

The block 134 performing error computation in FIG. 4 sends therefore to the quantum error correction block 131 both the measured syndrome $\hat{S}_i = S(\hat{P}_i)$, from block and $R_i \circ \hat{S}_i = S(\hat{E}_i)$ $R_i$ indicates the combined syndrome calculated by the syndrome error correction block 133 on the received state or codeword $E_i P_i|\psi_i\rangle$. The composite or intentional plus channel error is finally corrected in block 131 by applying the operator $\hat{P}_i^\dagger \hat{E}_i^\dagger$.

Thus, with this method the original error correction capability of the QECC is not affected by the classical piggyback channel, as long as errors on the PSC 20 are corrected by classical error correcting codes.

Based on the above, in FIG. 9 it is shown a diagram flow of an embodiment 300 of the method for sending first data as quantum information in qubits ($|\varphi\rangle$) and second classical data over a quantum channel, in particular in quantum information communication systems like system 10b, which includes applying QECC encoding, e.g. by block to said qubits ($|\varphi\rangle$) obtaining quantum information codewords, applied to a noisy channel 12b.

The method 300 includes, prior a step 310, analogous to step 210, of applying error syndromes $S_i$ representing said second data to the quantum information codewords $|\psi\rangle$) determined by the QECC encoder 11, e.g. by obtaining quantum information codewords with intentional errors applied upon, e.g. by using block 112, a step 305 of encoding information data $B_k$ with a classical error code correction encoder to obtain encoded error syndromes, forming c-codewords of a classical code, which are applied to the quantum information codewords $|\psi\rangle$ in step 310, analogous to step 210 besides the fact that error syndromes $S_i$ are classically encoded, i.e. determining quantum information codewords with intentional errors $P_i$ applied upon, $P_i|\psi_i\rangle$.

Then the step of transmitting 320 said quantum information codewords with intentional errors $P_{ii}$ applied upon over said noisy quantum channel 12b which outputs received codewords $E_i P_i|\psi_i\rangle$ at the receiving side 13b is performed.

Then the step 330 of computing error syndromes $S_i$; $R_i$ from said received codewords ($E_i P_i|\psi_i\rangle$) is performed which in this case includes
a step 333 of computing channel affected syndromes $R_i$ from the received codewords $E_i P_i|\psi_i\rangle$, e.g. in block 131 and
a step 337 of classical syndrome error correction on said channel affected syndromes $R_i$ to obtain classical corrected error syndromes $S_i$, e.g performed in block 133.

The channel affected syndromes $R_i$ are thus corrected with respect to errors introduced by the noisy quantum channel 12b by a classical channel decoder, block 133.

Then, as shown in FIG. 4, the operation of applying a correction operator obtained at least by said computed syndromes $R_i$ to obtain corrected codewords $|\hat{\psi}_i\rangle$ includes some more steps as the computed syndromes are the noisy channel affected syndromes, thus syndromes of the intentional error which carry the classical are still to be extracted.

Thus, obtaining said correction operator, which is in the end $\hat{P}_i^\dagger \hat{E}_i^\dagger$, includes performing an operation 340 of computation of the intentional error $\hat{P}_i$, to which corresponds the intentional error syndrome $S(\hat{P}_i)$ and of the channel error $\hat{E}_i$, to which corresponds the error channel syndrome $S(\hat{E}_i)$ on the basis of said channel affected syndromes $R_i$, obtained at step 333, and said classical corrected error syndromes $S_i$, obtained at step 337, using then said computed intentional error $S(\hat{P}_i)$ and channel error $S(\hat{E}_i)$ in step 350, e.g. in block 132, to obtain said correction operator $\hat{P}_i^\dagger \hat{E}_i^\dagger$, in particular as inverse of the computed intentional error $\hat{P}_i$ and channel error $\hat{E}_i$, finally outputting 360 said corrected codewords and said classical corrected error syndromes $S_i$.

The probability that classical piggybacking causes a not correctable error on the noisy quantum channel 13b is thus upper bounded by the residual syndrome error probability on the PSC after classical error correction, that it is indicated by $P_{e,PSC}$. In other words, piggybacking a classical channel on a quantum channel does not affect the error correction capability of the QECC correction, with probability at least $1-P_{e,PSC}$.

It is observed that the correction of a quantum error is made with a delay due to the need to wait the correction performed by the classical decoder. In this regard, the classical codes for the PSC should be designed in order to have a suitable latency.

In FIG. 5 it is shown an example of encoder for the [[3, 1]] QECC, which may be an embodiment of QECC encoder 111. The horizontal lines represent qubit states as a function of time. A vertical line connecting qubits with a closed dot on one side and an open dot with cross on the other side represents a conditional NOT gate (CNOT).

It includes data qubits $|\varphi\rangle$ as input and the q-codeword $|\psi\rangle$ is composed by the three (n=3) output qubits. The data qubit $|\varphi\rangle = \alpha|0\rangle + \beta|1\rangle$ is mapped into the q-codeword $\alpha|000\rangle + \beta|111\rangle$ using ancilla qubits $|\alpha_1\rangle$ and $|\alpha_2\rangle$, which are coupled to the data qubit $|\varphi\rangle$ using CNOT gates, in a way which is known per se.

Figure 6:
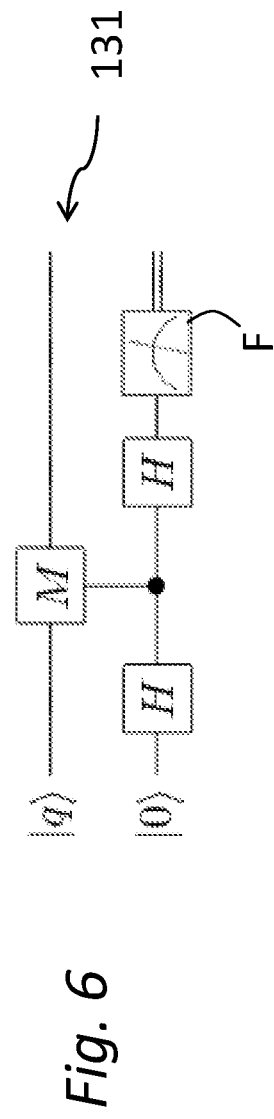

In FIG. 6 it is shown a circuit for measuring a single qubit $|q\rangle$ according to the operator M with eigenvalues ±1, which can be used to implement syndrome computation 132. The bottom is an ancilla qubit initialized in zero state $|0\rangle$ used for measurement. The boxed H represent a Hadamard gate. The output of the measurement block is ±1.

More in detail a Hadamard gate is performed on the ancilla qubit, which is then used with operator M to measure the single qubit $|q\rangle$. Then, a further Hadamard gate is performed on the ancillary qubit. Finally, the state of the ancillary qubit is measured by the block F to extract the error syndrome.

Figure 7:
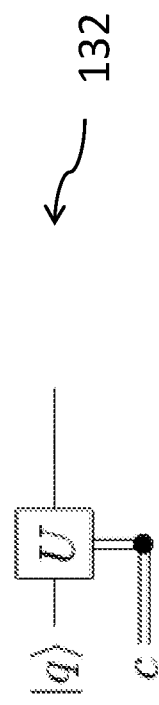

In FIG. 7 it is shown a quantum circuit to apply unitary operator U on a qubit $|q\rangle$ controlled by a classical bit c, which can represent the correction block 132, since to obtain the error it is necessary to measure according to single qubit operators M with eigenvalues ±1, like X, Y, Z, as shown in FIG. 6. To correct errors it is necessary to apply a unitary operator U, like X, Y, Z, controlled by a classical bit c.

In the circuit of FIG. 7, when the control bit is set the output is qubit $U|q\rangle$, otherwise the qubit $|q\rangle$ is left unchanged. U is a unitary operator.

The solution here described thus substantially provides piggybacking frames of quantum information via intentional errors for both noiseless and noisy quantum channels.

The solution here described adds classical information, i.e. control data, on top of quantum information, allowing for instance to annotate qubits to describe what they represents, who produced them, etc. Also the solution described allows reading and rewriting this annotation without destroying the quantum information. Another example of application is related to the possibility to have a quantum network (QN), where nodes exchange quantum information organized in packets.

It will be otherwise understood that the various individual implementing options exemplified throughout the figures accompanying this description are not necessarily intended to be adopted in the same combinations exemplified in the figures. One or more embodiments may thus adopt these (otherwise non-mandatory) options individually and/or in different combinations with respect to the combination exemplified in the accompanying figures.

Without prejudice to the underlying principles, the details and embodiments may vary, even significantly, with respect to what has been described by way of example only, without departing from the extent of protection. The extent of protection is defined by the annexed claims.

The invention claimed is:

1. Method for sending first data as quantum information in qubits ($|\varphi\rangle$) and classical second data ($S_i$) over a quantum channel, in particular in quantum information communication systems, which includes applying quantum error correction (QECC) encoding to said qubits ($|\varphi\rangle$) obtaining quantum information codewords ($|\psi\rangle$), wherein said method includes applying intentional errors ($P_i$) having error syndromes ($S_i$) representing said second classical data to said quantum information codewords ($|\psi\rangle$) obtaining quantum information codewords with intentional errors ($P_i$) applied upon ($P_i|\psi_i\rangle$), and transmitting from a transmitting side said quantum information codewords with intentional errors applied upon ($P_i|\psi_i\rangle$) over said quantum channel which outputs received codewords ($P_i|\psi_i\rangle$; $E_iP_i|\psi_i\rangle$) at a receiving side, computing error syndromes ($\hat{S}_i$; $R_i$) from said received codewords ($P_i|\psi_i\rangle$; $E_iP_i|\psi_i\rangle$), performing a QECC error correction operation on said received codewords ($P_i|\psi_i\rangle$; $E_iP_i|\psi_i\rangle$) by applying a correction operator ($\hat{P}_i^\dagger$, $\hat{P}_i^\dagger \hat{E}_i^\dagger$) obtained at least by said computed syndromes ($\hat{S}_i$; $R_i$) to obtain corrected codewords ($|\hat{\psi}_i\rangle$), outputting said corrected codewords ($|\hat{\psi}_i\rangle$) and said computed syndromes ($\hat{S}_i$).

2. The method of claim 1, wherein the method further includes encoding information data ($B_k$) with a classical error code correction encoder to obtain encoded error syndromes ($S_i$) which are applied as said error syndromes to the quantum information codewords ($|\psi\rangle$), said computing error syndromes ($S_i$; $R_i$) from said received codewords ($E_iP_i|\psi_i\rangle$) including a step of computing channel affected syndromes ($R_i$) from the received codewords ($E_iP_i|\psi_i\rangle$) and a step of classical syndrome error correction on said channel affected syndromes ($R_i$) to obtain classical corrected error syndromes ($S_i$), said applying a correction operator ($\hat{P}_i^\dagger, \hat{P}_i^\dagger \hat{E}_i^\dagger$) obtained at least by said computed syndromes ($S_{i,}$; $R_i$) to obtain corrected codewords ($|\hat{\psi}_i\rangle$) includes obtaining said correction operator ($\hat{P}_i^\dagger, \hat{P}_i^\dagger \hat{E}_i^\dagger$) by performing an operation of computation of the intentional error ($\hat{P}_i$) and of a channel error of the quantum channel to which the computed syndrome is associated ($S(\hat{E}_i)$) on the basis of said channel affected syndromes ($R_i$) and said classical corrected error syndromes ($\hat{S}_i$), using said computed intentional error ($\hat{P}_i$) and channel error ($\hat{E}_i$) to obtain said correction operator ($\hat{P}_i^\dagger, \hat{P}_i^\dagger \hat{E}_i^\dagger$), in particular as inverse of the computed intentional error ($\hat{P}_i$) and channel error $S(\hat{E}_i)$.

3. The method of claim 1, wherein said applying a correction operator ($P_i|\psi_i\rangle$; $E_iP_i|\psi_i\rangle$) obtained at least by said computed syndromes ($S_{i,}$; $R_i$) to obtain corrected codewords ($|\hat{\psi}_i\rangle$) includes obtaining the intentional error from said computed syndromes and computing the correction on the basis of said intentional error, in particular as inverse of the intentional error ($\hat{P}_i^\dagger$).

4. The method of claim 1, wherein applying intentional errors ($P_i$) having error syndromes ($S_i$) representing said second classical data to said quantum information codewords ($|\psi\rangle$) obtaining quantum information codewords with intentional errors ($P_i$) applied upon ($P_i|\psi_i\rangle$) includes introducing in the quantum information codewords intentional errors ($P_i$) determined by corresponding syndromes ($S_i$).

5. The method of claim 1, wherein said second classical data ($S_i$) represent communication control data.

6. The method of claim 1, wherein said second classical data ($S_i$) represent a synchronization word which is attached to selected codewords.

7. A quantum communication system configured to send first data as quantum information in qubits ($|\varphi\rangle$) and classical second data ($S_i$) over a quantum channel, comprising a quantum information transmission module which includes a quantum error correction (QECC) encoder configured to apply QECC encoding to said qubits ($|\varphi\rangle$) obtaining quantum information codewords ($|\psi\rangle$), wherein said quantum information transmission module is configured to apply intentional errors ($P_i$) having error syndromes ($S_i$) representing said second classical data to said quantum information codewords ($|\psi\rangle$) obtaining quantum information codewords with intentional errors ($P_i$) applied upon ($P_i|\psi_i\rangle$), and transmit from a transmitting side said quantum information codewords with intentional errors applied upon ($P_i|\psi_i\rangle$) over said quantum channel which outputs received codewords ($P_i|\psi_i\rangle$; $E_iP_i|\psi_i\rangle$) at a receiver module comprised in said system, said receiver module being configured to compute error syndromes ($S_{i,}$; $R_i$) from said received codewords ($P_i|\psi_i\rangle$; $E_iP_i|\psi_i\rangle$), perform a QECC error correction operation on said received codewords ($P_i|\psi_i\rangle$; $E_iP_i|\psi_i\rangle$) by applying a correction operator ($\hat{P}_i^\dagger, \hat{P}_i^\dagger \hat{E}_i^\dagger$) obtained at least by said computed syndromes ($S_{i,}$; $R_i$) to obtain corrected codewords ($|\hat{\psi}_i\rangle$), output said corrected codewords ($|\hat{\psi}_i\rangle$) and said computed syndromes ($S_{i,}$).

8. The system of claim 7, wherein said transmitter module includes a classical error code correction encoder configured to encode information data ($B_k$) to obtain encoded error syndromes ($S_i$) which are applied as said error syndromes to the quantum information codewords ($|\psi\rangle$), said receiver module configured to compute error syndromes ($S_{i,}$; $R_i$) from said received codewords ($E_iP_i|\psi_i\rangle$) including one or more modules configured to compute channel affected syndromes ($R_i$) from the received codewords ($E_iP_i|\psi_i\rangle$), and perform a classical syndrome error correction on said channel affected syndromes ($R_i$) to obtain classical corrected error syndromes ($\hat{S}_i$), an application of a correction operator ($\hat{P}_i^\dagger, \hat{P}_i^\dagger \hat{E}_i^\dagger$) obtained at least by said computed syndromes ($S_{i,}$; $R_i$) to obtain corrected codewords ($|\hat{\psi}_i\rangle$) including obtaining said correction operator ($\hat{P}_i^\dagger, \hat{P}_i^\dagger \hat{E}_i^\dagger$) by performing an operation of computation of the intentional error ($\hat{P}_i$) and of a channel error ($\hat{E}_i$) of the quantum channel on the basis of said channel affected syndromes ($R_i$) and said classical corrected error syndromes ($\hat{S}_i$), using said computed intentional error ($\hat{P}_i$) and channel error ($\hat{E}_i$) to obtain said correction operator ($\hat{P}_i^\dagger; \hat{P}_i^\dagger \hat{E}_i^\dagger$), in particular as inverse of the computed intentional error ($\hat{P}_i$) and channel error ($\vec{E}_i$).

9. The system of claim 7, wherein the receiver module is configured to apply a correction operator ($\hat{P}_i^\dagger, \hat{P}_i^\dagger \hat{E}_i^\dagger$) obtained at least by said computed syndromes ($S_{i,}$; $R_i$) to obtain corrected codewords ($|\hat{\psi}_i\rangle$) includes obtaining the intentional error from said computed syndromes and computing the correction on the basis of said intentional error, in particular as inverse of the intentional error ($\hat{P}_i^\dagger$).

* * * * *